(12) United States Patent
Glantschnig et al.

(10) Patent No.: US 9,502,277 B2
(45) Date of Patent: Nov. 22, 2016

(54) APPARATUS, IN PARTICULAR END EFFECTOR

(71) Applicant: Mechatronic Systemtechnik GmbH, Villach (AT)

(72) Inventors: Arno Glantschnig, Reichersdorf (AT); Andreas Schett, Sillian (AT)

(73) Assignee: Mechatronic Systemtechnik GmbH, Villach (AT)

( * ) Notice: Subject to any disclaimer, the term of this patent is extended or adjusted under 35 U.S.C. 154(b) by 0 days.

(21) Appl. No.: 14/914,691

(22) PCT Filed: Aug. 28, 2014

(86) PCT No.: PCT/EP2014/068305
§ 371 (c)(1),
(2) Date: Feb. 26, 2016

(87) PCT Pub. No.: WO2015/028570
PCT Pub. Date: Mar. 5, 2015

(65) Prior Publication Data
US 2016/0211164 A1    Jul. 21, 2016

(30) Foreign Application Priority Data

Aug. 28, 2013 (EP) .................................... 13182110

(51) Int. Cl.
*B25J 15/06* (2006.01)
*H01L 21/683* (2006.01)

(52) U.S. Cl.
CPC ........ *H01L 21/6838* (2013.01); *B25J 15/0616* (2013.01)

(58) Field of Classification Search
CPC ................... H01L 21/6838; H01L 21/68707; H01L 21/68735; B25J 15/0616; B25J 15/0052; B25J 15/006

USPC ........................... 294/2, 213, 188, 64.3, 185
See application file for complete search history.

(56) References Cited

U.S. PATENT DOCUMENTS 6,152,507 A * 11/2000 Pirker .................. B65G 47/911
                                                        294/119.1
7,434,856 B2    10/2008 Gerhard et al.
(Continued)

FOREIGN PATENT DOCUMENTS

DE    101 61 902 A1    7/2003
DE    102 59 836 A1    7/2004
(Continued)

OTHER PUBLICATIONS

International Search Report of PCT/EP2014/068305, mailed Dec. 8, 2014.

*Primary Examiner* — Gabriela Puig
(74) *Attorney, Agent, or Firm* — Collard & Roe, P.C.

(57) ABSTRACT

An apparatus, in particular end effector, for receiving, transporting and/or positioning a wafer frame which is covered by a carrier film for carrying a wafer, has a holder which has vacuum nozzles for holding the wafer frame on the apparatus, and has a centering device which has at least one stop, which can engage in a cutout in the wafer frame, for centering the wafer frame. In order to precisely position the wafer frame, the holder has Bernoulli nozzles for holding and moving the wafer frame in the direction of the stop without contact, and the stop is mounted such that it can be adjusted against the movement direction generated by the Bernoulli nozzles from an initial position to a centering position, which differs from the initial position, for centering the wafer frame.

14 Claims, 4 Drawing Sheets

(56) References Cited

U.S. PATENT DOCUMENTS

| | | | |
|---|---|---|---|
| 8,196,983 B2* | 6/2012 | Nagasaka | H01L 21/6838 294/64.2 |
| 8,444,126 B2* | 5/2013 | Siebert | H01L 21/68 269/21 |
| 2008/0038903 A1 | 2/2008 | Yamamoto | |
| 2008/0129064 A1* | 6/2008 | Harvey | H01L 21/6838 294/64.3 |
| 2012/0257952 A1 | 10/2012 | Palm et al. | |
| 2014/0227045 A1* | 8/2014 | Iwasaka | H01L 21/6838 406/88 |
| 2015/0179495 A1* | 6/2015 | Huang | H01L 21/6838 356/237.5 |
| 2015/0325466 A1* | 11/2015 | Wang | H01L 21/6838 279/3 |
| 2016/0008986 A1* | 1/2016 | Sun | B65G 49/061 294/64.3 |

FOREIGN PATENT DOCUMENTS

| | | |
|---|---|---|
| EP | 1 291 901 A2 | 3/2003 |
| WO | 2006/072422 A1 | 7/2006 |
| WO | 2008/070302 A2 | 6/2008 |

* cited by examiner

APPARATUS, IN PARTICULAR END EFFECTOR

CROSS REFERENCE TO RELATED APPLICATIONS

This application is the National Stage of PCT/EP2014/068305 filed on Aug. 28, 2014, which claims priority under 35 U.S.C. §119 of European Application No. 13182110.0 filed on Aug. 28, 2013, the disclosure of which is incorporated by reference. The international application under PCT article 21(2) was not published in English.

TECHNICAL FIELD

The invention relates to an apparatus, particularly end effector, for taking up, transporting and/or positioning of a wafer frame, which is covered by a carrier film for carrying a wafer, having a holder that has vacuum nozzles for holding the wafer frame on the apparatus, and having a centering device that has at least one stop that can engage into a recess of the wafer frame, for centering of the wafer frame.

STATE OF THE ART

In order to be able to remove a wafer frame, which is covered by a carrier film for carrying a wafer, from a cassette, end effectors or grippers are known (DE10259836A1) which hold the carrier film and/or the wafer frame in place on the gripper with vacuum nozzles. For centering of the removed wafer frame, the gripper is provided with a centering device that has a stop for the wafer frame. For this purpose, the stop has multiple adjustment pins that engage into recesses of the wafer frame, as well as a stop element that lies flat against the wafer frame.

It is disadvantageous that in the case of such a centering device, extremely precise guidance of the gripper is required, so that stops and wafer frame can interact with one another or so as to remove the wafer frame in reliable manner. Furthermore, for this interaction, it is absolutely necessary that the wafer frame is aligned. Even slight position deviations of the wafer frame can lead to it becoming wedged between the stop elements and thereby prevent secure holding of a wafer frame. Because of failures in semiconductor production lines or semiconductor processing lines caused in this way, for example due to repairs under cleanroom conditions, production failures, etc., such grippers are only suitable with limitations in this sector of technology.

From the state of the art, end effectors for wafer slices are also known (DE10161902A1). Such end effectors are provided with vacuum nozzles and Bernoulli nozzles, in order to thereby hold the wafer on the end effector. Furthermore, a centering device is provided for centering of the wafer on the end effector, which device pushes the wafer from a starting position into a centering position with diametrically opposite flat stops. This centering is supported by the concentric arrangement of the Bernoulli nozzles. It is disadvantageous that after positioning of the wafer into the centering position, rotational alignment of the wafer is required, for which purpose a turntable is assigned to the holder. However, this disadvantageously leads to significant design effort and is furthermore not suitable for centering of wafer frames that hold a wafer by way of a carrier film.

Furthermore, a gripper for wafers or other objects in slice form or plate form is known from WO2006/072422A1. This gripper has a stop apparatus and an anti-rotation device for the object. The stop apparatus serves for centering of the object on the gripper—the anti-rotation device serves for rotational fixation of the object on the gripper. The stops of the stop apparatus can also form the anti-rotation device, in that these undertake centering in a first step, and then, in a further step, undertake rotational fixation by means of movement of the stops. During this movement of the stops, the centered object does not depart from its centering position.

PRESENTATION OF THE INVENTION

The invention is therefore based on the task, proceeding from the state of the art as described initially, of improving an end effector to the effect that the wafer, together with the wafer frame, is reliably and precisely centered relative to the end effector, and nevertheless, no impairment occurs during further handling steps. Furthermore, this apparatus is also supposed to demonstrate great stability.

The invention accomplishes the set task in that the holder has Bernoulli nozzles for contact-free holding and moving of the wafer frame in the direction of the stop, and that the stop is adjustably mounted counter to the movement direction produced by the Bernoulli nozzles, from a starting position into a centering position for centering of the wafer frame, which is different from the former.

If the holder has Bernoulli nozzles for contact-free holding and moving of the wafer frame in the direction of the stop—among other things using a hydrodynamic partial vacuum caused by the Bernoulli effect—and if the stop is mounted so as to be adjustable counter to the movement direction produced by the Bernoulli nozzles, from a starting position into a centering position that is different from the former, a wafer frame can be gripped by the gripper without problems and can subsequently be centered in reliable manner. For this purpose, the Bernoulli nozzles ensure not only contact-free holding of the wafer frame together with its carrier film and of the water, but rather also reliable displacement of the held wafer frame in the direction of the stop—specifically independent of the starting position of the gripped wafer frame. The apparatus according to the invention can therefore prove to be extremely tolerant with regard to position deviations of the wafer frame to be gripped, and thereby can also ensure stable holding. Furthermore, the wafer frame is centered after the stop has been moved into the centering position, because the other alignment axis is established by the stop that engages into recesses. Furthermore, movable mounting of the stop allows the stop to be removed from the wafer frame, if this should become necessary during the course of a processing step. Furthermore, the vacuum nozzles can take over firm mounting of the wafer frame on the apparatus. The stop can therefore prevent impairment of further handling steps of the wafer frame.

In general, it should be mentioned that adjustable mounting of the stop is, of course, provided not only in the centering position but also back from this position into the starting position. The term Bernoulli effect describes the known effect for contact-free holding of a work piece by means of the partial vacuum caused by a gas stream that exits from a nozzle. In order to form a Bernoulli effect for a circular work piece, nozzles disposed in ring shape, but also a ring nozzle can be used. Of course, other nozzle arrangements are also conceivable, with which the desired gas stream can be produced. Furthermore, it should be made clear that in the course of this invention, the use of a wafer frame also includes at least the carrier film and possibly the wafer equipped with it.

The stability of the alignment of the wafer frame along an axis can be increased if the stop forms two parallel centering projections that each engage into a recess on the wafer frame. Furthermore, particularly precise alignment between stop and wafer frame can be achieved using the centering projections and the corresponding recess of the wafer frame. Precise occupation of the centering position of the wafer frame on the apparatus can thereby be ensured.

If the centering device has a linear guide between stop and apparatus, the centering position can be approached in particularly simple manner.

In an advantageous embodiment of the apparatus, the centering device has a compressed air drive for movement of the stop. Because of the low maintenance requirement of a pneumatic drive, a particularly stable apparatus can thereby be created.

The design effort in the region of the guide of the stop can be further reduced if the centering device has a spring element connected with the stop, to return the stop, in other words into its starting position.

If the Bernoulli nozzles are disposed so as to be distributed asymmetrically over the holder, the wafer can be moved in the direction of the stop in contact-free manner, in simple manner in terms of design, by means of the gas stream, that occurs. Furthermore, in this way it can be ensured that the Bernoulli nozzles always allow the wafer frame to run toward or up against the stop, even during displacement from the starting position to the centering position.

The specific region of the wafer frame that is reserved for provision of the wafer or on which the wafer is provided can be protected, relative to direct impact by the Bernoulli nozzles, in that the Bernoulli nozzles are disposed on the holder so as to be distributed in the film region between wafer frame and wafer. If the Bernoulli nozzles are disposed concentrically, uniform contact-free movement of the wafer frame above the holder can be ensured. Furthermore, secure handling can be achieved with a uniform holding force on the wafer frame or its carrier film.

A stable hydrodynamic partial vacuum, directed outward, can be produced if the Bernoulli nozzles are directed outward at a slant.

Advancement of the wafer frame in the direction of the stop can be made possible, in terms of design, in that the stop-side Bernoulli nozzles are directed parallel to the movement direction, and the Bernoulli nozzles that lie opposite them are directed outward at a slant, proceeding from the inner center.

As an alternative to the preceding or in order to improve the advancement, the slant angle α of the stop-side Bernoulli nozzles can differ in size from the slant angle β of the opposite Bernoulli nozzles.

If multiple vacuum nozzles are provided on the outer edge of the holder, the wafer frame can be securely held on the apparatus. Furthermore, in this way stresses that act directly on the carrier film or the wafer can be prevented, and damage to the film or wafer can be excluded—particularly since it cannot be excluded that the wafer is already present on the carrier film in sawn-apart form and that, it must be feared that the wafer will come loose. If the vacuum nozzles are provided at diametrically opposite projections of the holder, the wafer frame can be held on the apparatus in particularly firm manner.

If the holder has an outer region and an inner region that is elevated relative to the former, which regions form a stop edge for the wafer frame between them, centering of the wafer frame can be additionally facilitated. This is because the number of possible starting positions can be restricted by the stop edge when the wafer frame is gripped, particularly if a circumferential stop edge is provided.

It is advantages that the vacuum nozzles can be provided in the outer region and the Bernoulli nozzles can be provided in the inner region, in order to thereby facilitate contact-free centering of the wafer frame as well, as firm holding of the wafer frame in the centering position.

The stop edge can run toward the inner region at a slant, in order to reduce the risk of damage to the carrier film during gripping and subsequent centering of the wafer frame.

BRIEF DESCRIPTION OF THE DRAWINGS

In the figures, the object of the invention is shown in greater detail as an example, using an embodiment variant. The figures show.

WAY TO IMPLEMENT THE INVENTION

Figure 1:
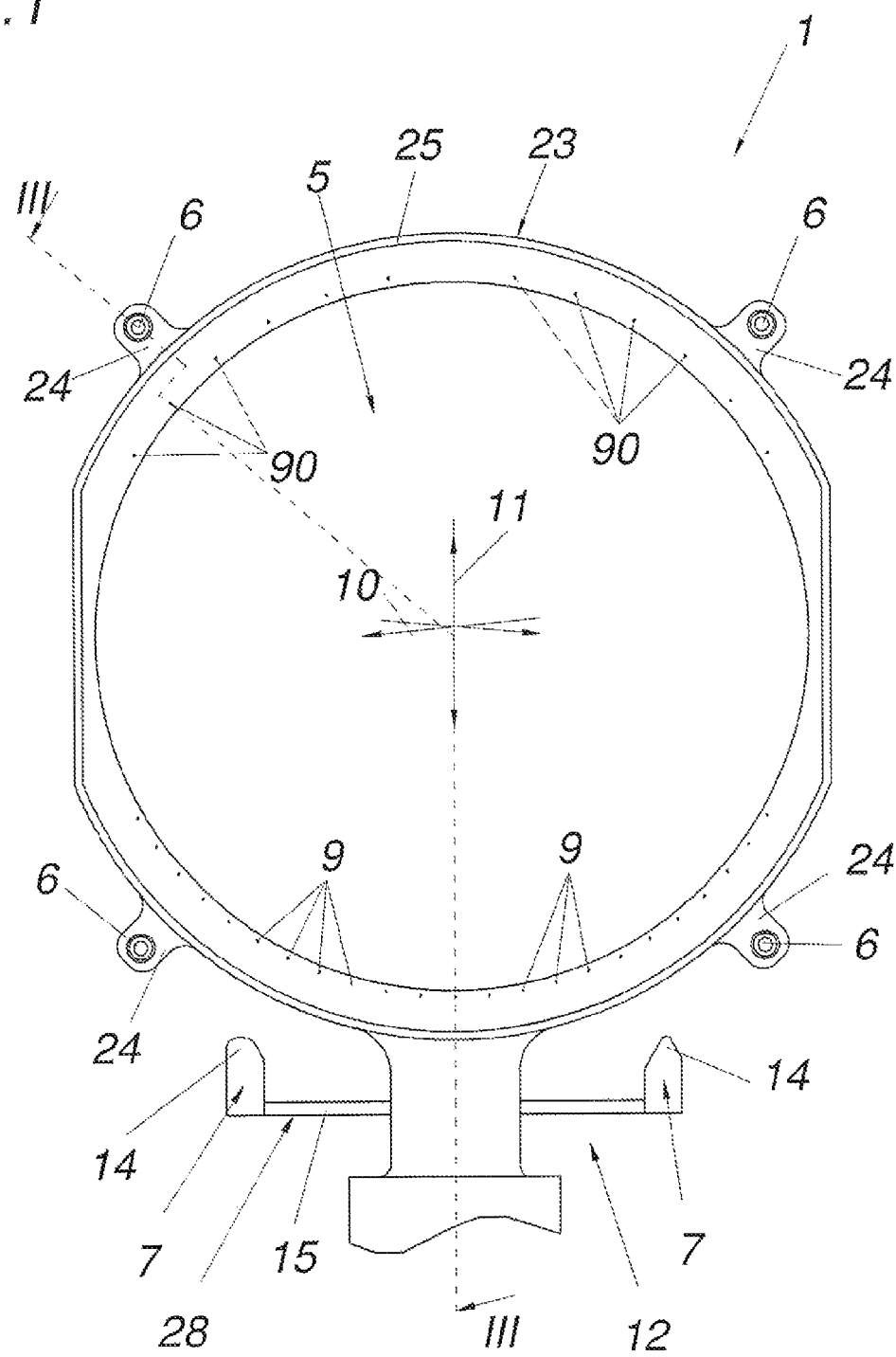
FIG. 1 a top view of an apparatus for taking up, transporting and/or positioning of a wafer frame, FIG. 2 a tear-away and enlarged top view of FIG. 1, FIG. 3 a sectional view according to III-III of the apparatus represented according to FIG. 1, FIG. 4 a top view of the apparatus according to FIG. 1, with a held wafer frame, and FIG. 5 a top view of the apparatus according to FIG. 1, with a held wafer frame in its centering position.
Figure 3:
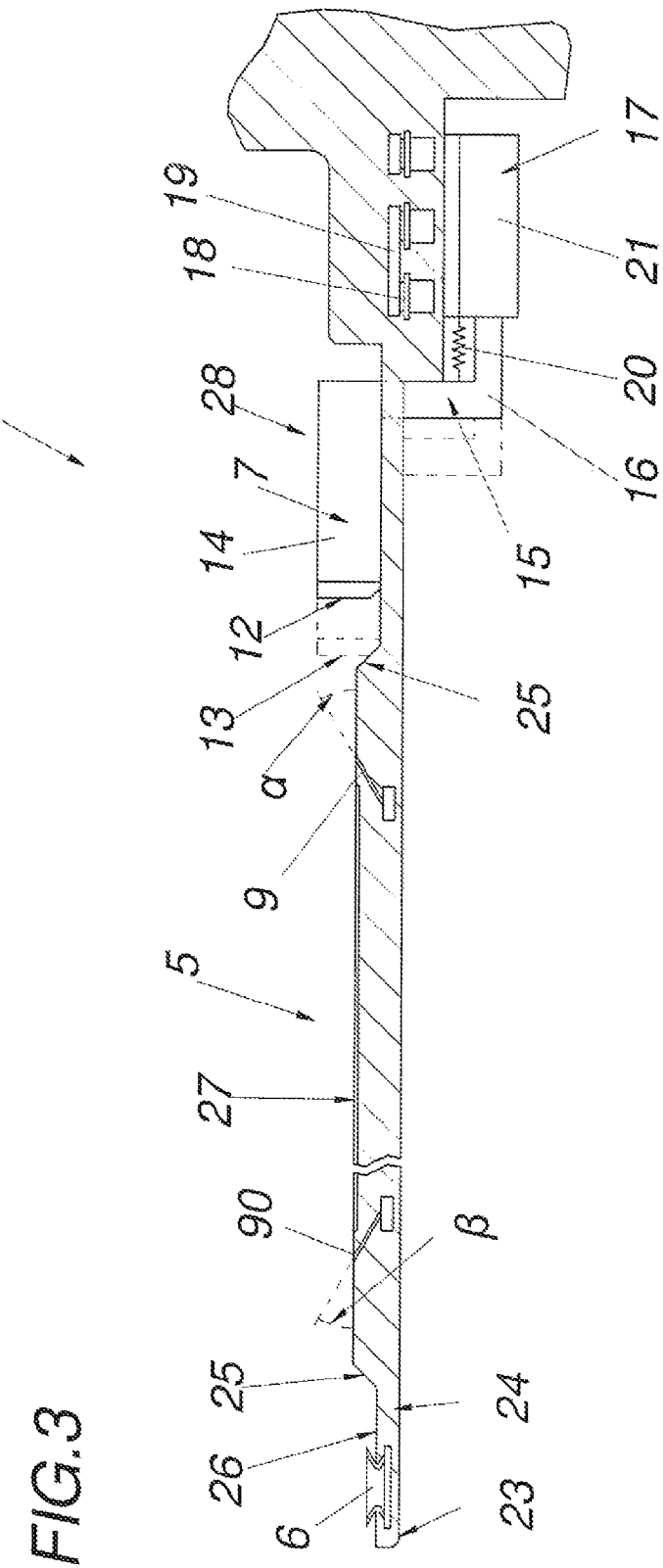
Figure 4:
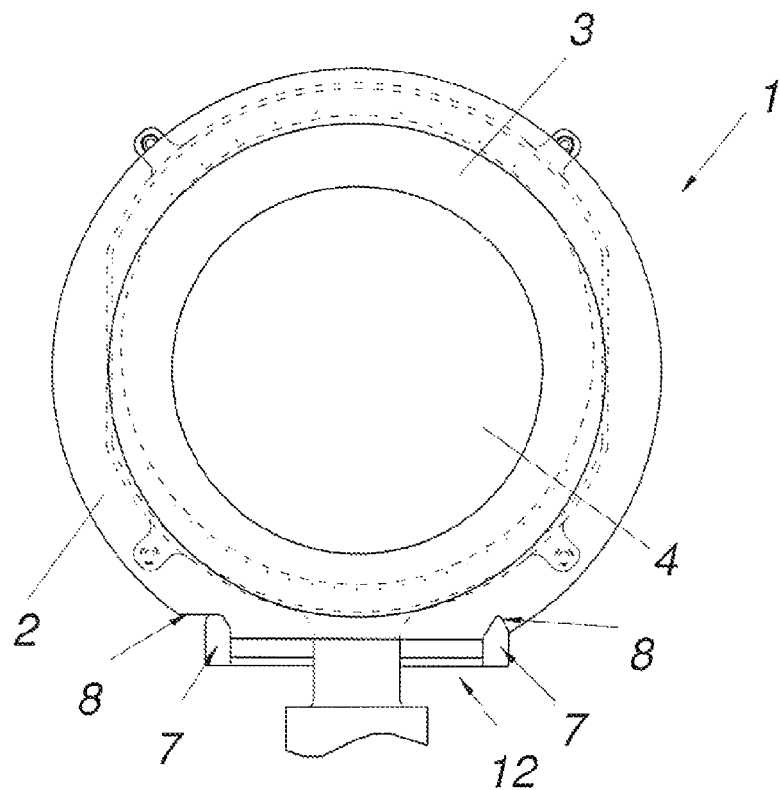
Figure 5:
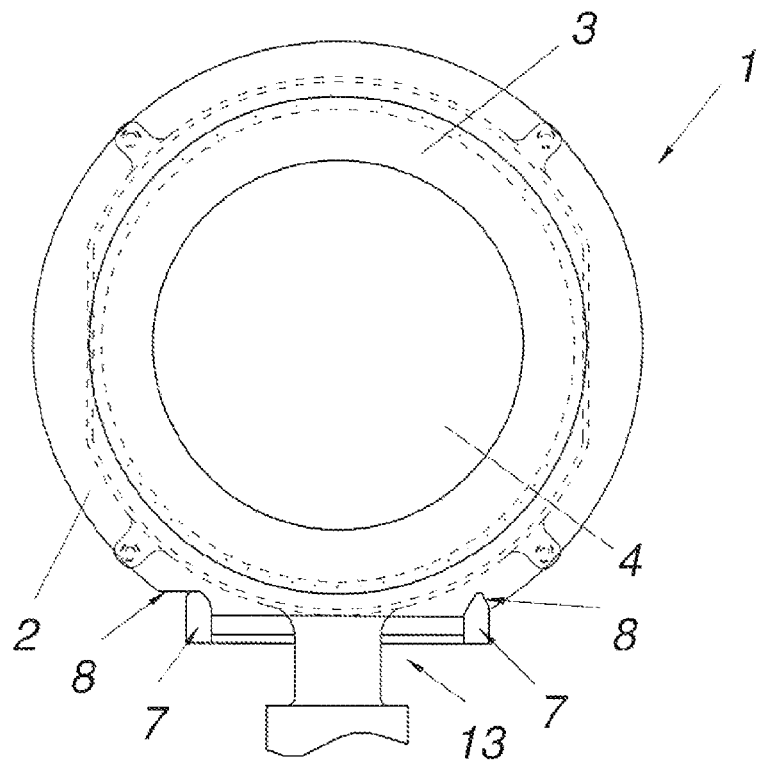

According to FIGS. 1, 3, and 4, a top view of an apparatus 1 for taking up, transporting and/or positioning of a wafer frame 2, which apparatus is structured as an end effector or gripper, is shown as an example. The wafer frame 2, which is shown in greater detail according to FIGS. 3 and 4, stretches out a carrier film 3 that carries a wafer 4 or semiconductor wafer with material fit. In order to firmly connect the wafer frame 2 stretching out the film with the apparatus 1, the apparatus 1 is provided with a holder 5, to which vacuum nozzles 6 for drawing the wafer frame 2 against the holder or the device 1 by suction are assigned. Furthermore, a centering device 28 having a stop 7 is situated on the apparatus 1, which stop is configured so that it can engage into two recesses 8 on the wafer frame 2. The stop 7 serves for centering of the held wafer frame 2 or of the wafer 4 on the apparatus 1, after the wafer frame 2 has been taken up—for example from a cassette, not shown in any detail. For taking up of the apparatus 1 that is tolerant relative to the position of the wafer frame 2, the holder is provided with Bernoulli nozzles 9, 90, which not only hold the wafer, frame 2 in contact-free manner, but which are also provided and/or configured in such a manner that the wafer frame 2 is moved in the direction of the stop 7 and thereby constantly pressed against the stop 7. Because the stop 7 engages into recesses 8 of the wafer frame, centering of the wafer frame 2 or of the wafer 4 along the movement axis 10 is achieved. Contact-free holding of the wafer frame 2 is made possible by means of the hydrodynamic partial vacuum of the Bernoulli nozzles 9, 90 that is known as the Bernoulli effect in the state of the art. In that the stop 7 is mounted so as to be adjustable, counter to the movement direction 11 produced by the Bernoulli nozzles 9, 90, from a starting position 12 into a centering position 13 that is different from the former, the wafer frame 2, pressed against the stop 7, can also be centered in its movement axis 11. This centering process can be understood by looking at FIGS. 4 and 5 together. The wafer frame 2, centered according to FIG. 5, is reliably held in place in this centering position 13, during subsequent events, by means of activation of the vacuum nozzles 6. The Bernoulli nozzles 9, 90 can then, be shut off. In this way, an apparatus 1 is created, which is able to take up, transport, and position a wafer frame 2 in stable manner, under simple handling conditions.

The wafer frame 2 is held by the stop 7 in particularly secure manner, with shape fit, if the latter forms two parallel centering projections 14. Because these are introduced into narrowing recesses 8 on the wafer frame 2, imprecisions in the alignment of the wafer frame 2 in the movement axis 10 are also evened out. This furthermore occurs automatically by means of the movement in the movement direction 11 and/or 12 that is forced on the wafer frame by the Bernoulli nozzles 9, 90.

The movement of the stop 7 is made possible using a linear guide 15 on the holder 5. Of course, other guides are also conceivable for this. This linear guide 15, provided between holder 5 and stop 7, is implemented using a piston rod 16 of a compressed air drive 17. It is advantageous if the compressed air drive 17 is supplied with compressed air by way of a valve 18 that is connected with the gas feed 19 of the Bernoulli nozzles 9, 90. This compressed air drive 17, structured as a single-action cylinder, is reset into its starting position 12 by way of a spring element 20. For this purpose, the spring element 20 engages on the piston rod 16 and on the housing 21 of the compressed air drive 17.

As can particularly be seen in FIG. 1, the Bernoulli nozzles 9, 90 are disposed so as to be asymmetrically, concentrically distributed over the holder 5, in order to thereby always maintain a movement direction 11 of the wafer frame 2 in the direction of the stop 7. With a simple design, a lower number of Bernoulli nozzles 90 is provided on the edge of the holder 5 opposite the stop 7 than is the case for the Bernoulli nozzles 9 at the edge of the holder 5 bordering on the stop 7.

The wafer is protected against direct impact of the Bernoulli nozzles 9, 90, in that these Bernoulli nozzles are disposed exclusively in the region of the carrier film 3 between wafer frame 2 and wafer 4, distributed over the holder 5. In general, it is conceivable to dispose further Bernoulli nozzles, not shown in any detail, in the region of the center of the holder 5 or underneath the wafer 4, etc. Preferably, however, all the Bernoulli nozzles 9, 90 are situated in the region of the carrier film 3 between wafer frame 2 and wafer 4.

As can be seen in FIG. 3, the Bernoulli nozzles 9, 90 are aligned outward at a slant. This is advantageous, among other things, for uniform spacing during contact-free holding of the wafer frame 2. Furthermore, the slant angles α and β of the stop-side Bernoulli nozzles 9 and of the Bernoulli nozzles 90 that lie opposite the stop-side Bernoulli nozzles 9 can be seen in FIG. 3. These slant angles α and β are different in size, in order to thereby be ready to reliably impose a movement direction 11 on the wafer frame 2.

Figure 2:
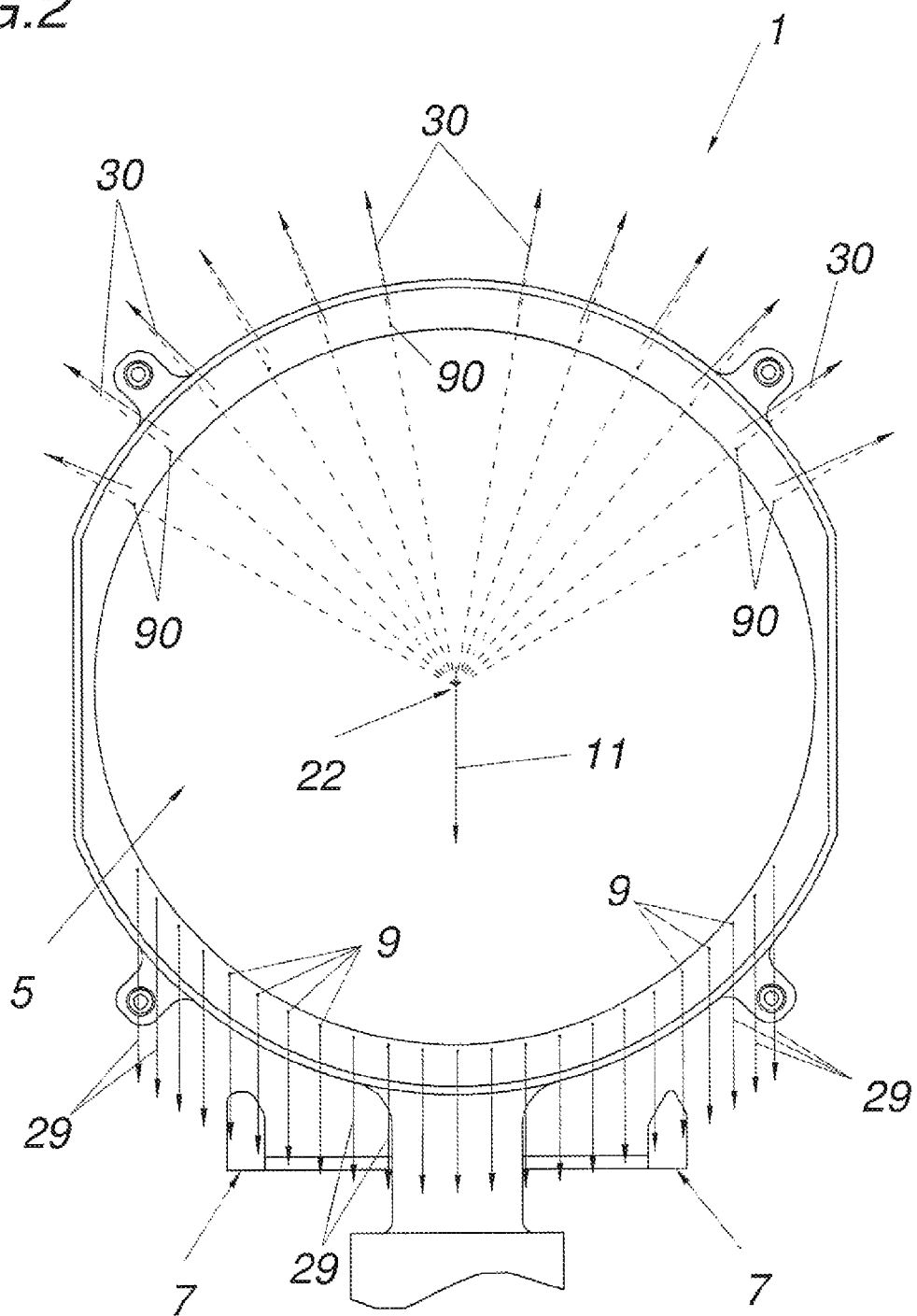

As can be seen in FIG. 2, the Bernoulli nozzles 9, 90 are aligned differently in a top view, as well. Specifically, the stop-side Bernoulli nozzles 9 have a parallel flow direction 29, and the Bernoulli nozzles 90 that lie opposite them have a flow direction 30 that runs apart in star shape. For this purpose, the stop-side Bernoulli nozzles 9 are directed parallel to the movement direction 11, and the Bernoulli nozzles 90 that lie opposite them are directed outward at a slant, proceeding from the inner center 22. This further improves the precision of the centering of the wafer frame 2, because play between wafer frame 2 and stop 7 is prevented on the basis of the force developed in this manner, against the stop 7.

The vacuum nozzles 6 are provided on the outer edge 23 of the holder 5, specifically at diametrically opposite projections 24, which allows a compact construction of the apparatus 1.

As can furthermore be seen in greater detail in FIGS. 1, 2, and 3, the holder 5 forms a circumferential stop edge 25 for the wafer frame 2. This is accomplished, in terms of design, by an outer region 26 and an inner region 27 that is elevated relative to the former. The wafer frame 2, moved in contact-free manner, cannot slip off the holder 5 over this edge. The apparatus 1 thereby offers maximal handling security in taking up, transporting and/or positioning of a wafer frame 2 or wafer 4. Damage to the wafer frame 2 is prevented using a stop edge 25 that runs at a slant toward the inner region 27.

In a simple design, the nozzles 6, 9 are separated from one another by outer region 26 and an inner region 27 that is elevated relative to the former, in that the vacuum nozzles 6 are provided in the outer region 26 and the Bernoulli nozzles 9, 90 are provided in the inner region 27. An embodiment of the wafer frame end effector or of the apparatus 1 will be explained in greater detail, using work steps carried out as examples. To take up the wafer frame 2, brief drawing in by suction takes place with the vacuum nozzles 6, so that the inner region of the holder 5 comes close enough to the carrier film 3. Subsequently, the Bernoulli nozzles 9, 90 in the inner region 27 of the holder 5 are activated, in order to form a partial vacuum in accordance with the Bernoulli effect. Now the wafer frame 2 hangs on the apparatus 1 in contact-free manner, and can align itself laterally on its own, when the wafer frame 2 or frame is introduced into a transport box, for example, or taken out of one.

Centering of the wafer frame 2, according to the invention, takes place in a subsequent step. In this regard, the wafer frame 2 strives to reach the stop 7 of the apparatus 1, on the basis of the asymmetrical gas flow that is brought about by the asymmetrically disposed Bernoulli nozzles 9, 90 (see FIG. 4). Centering of the wafer frame 2 in the direction of the longitudinal axis of the apparatus 1 takes place by means of the centering projections 14 that are distinct in the stop 7, and the related recesses 8 in the wafer frame 2. The wafer frame 2 is now situated in its starting position 12 of the centering process—as can be seen in FIG. 4. According to the invention, the stop 7 is now positioned along the linear guide path, transverse to the longitudinal axis, into the defined centering position 13. This takes place counter td the movement direction 11 predetermined by the asymmetrical Bernoulli nozzles 9, 90. Once the centering position 13 has been reached, the vacuum nozzles 6 are activated in order to hold the wafer frame 2 in place on the apparatus 1 in the defined centering position. According to the invention, the stop 7 can now be returned to its starting position 12, and the Bernoulli nozzles 9, 90 can be shut off, in order to make further work steps possible, in simple manner.

The invention claimed is:

1. Apparatus, particularly end effector, for taking up, transporting and/or positioning of a wafer frame (2), which is covered by a carrier film (3) for carrying a wafer (4), having a holder (5) that has vacuum nozzles (6) for holding the wafer frame (2) on the apparatus, and having a centering device (28) that has at least one stop (7) that can engage into a recess (8) of the wafer frame (2), for centering of the wafer frame (2), wherein the holder (5) has Bernoulli nozzles (9, 90) for contact-free holding and moving of the wafer frame (2) in the direction of the stop (7), and wherein the stop (7) is adjustably mounted counter to the movement direction

(11) produced by the Bernoulli nozzles (9, 90), from a starting position (12) into a centering position (13) for centering of the wafer frame (2) that is different from the former.

2. Apparatus according to claim 1, wherein the stop (7) forms two parallel centering projections (14), which each engage into a recess (8) on the wafer frame.

3. Apparatus according to claim 1, wherein the centering device (28) has a linear guide (15) between stop (7) and apparatus (1).

4. Apparatus according to claim 1, wherein the centering device (28) has a compressed air drive (17) for movement of the stop (7).

5. Apparatus according to claim 1, wherein the centering device (28) has a spring element (20) connected with the stop (7), for return of the stop (7).

6. Apparatus according to claim 1, wherein Bernoulli nozzles (9, 90) are disposed so as to be asymmetrically distributed over the holder (5).

7. Apparatus according to claim 1, wherein the Bernoulli nozzles (9, 90) are disposed on the holder (5), distributed in the film region between wafer frame (2) and wafer (4), particularly concentrically.

8. Apparatus according to claim 1, wherein the Bernoulli nozzles (9, 90) are directed outward at a slant and comprise a stop-side set of Bernoulli nozzles and an opposite set of Bernoulli nozzles.

9. Apparatus according to claim 8, wherein the stop-side Bernoulli nozzles (9) are directed parallel to the movement direction (11), and the Bernoulli nozzles (90) that lie opposite them are directed outward at a slant, proceeding from the inner center.

10. Apparatus according to claim 8, wherein the slant angle ($\alpha$) of the stop-side Bernoulli nozzles (9) is different in size from the slant angle ($\beta$) of the opposite Bernoulli nozzles (90).

11. Apparatus according to claim 1, wherein vacuum nozzles (6) are provided on the outer edge (23) of the holder (5), particularly at diametrically opposite projections (24) of the holder (5).

12. Apparatus according to claim 1, wherein the holder (5) has an outer region (26) and an inner region (27) that is elevated relative to the former, which regions form a stop edge (25), particularly a circumferential edge for the wafer frame (2) between them.

13. Apparatus according to claim 12, wherein the vacuum nozzles (6) are provided in the outer region (26) and the Bernoulli nozzles (9, 90) are provided in the inner region (27).

14. Apparatus according to claim 12, wherein the stop edge (25) runs at a slant toward the inner region (27).

* * * * *